(12) United States Patent
Wu et al.

(10) Patent No.: US 10,811,442 B2
(45) Date of Patent: Oct. 20, 2020

(54) DISPLAY PANEL WITH LEDS IN DIFFERENT THICKNESSES FORMING A FLAT SURFACE AND METHOD FOR FABRICATING DISPLAY PANEL

(71) Applicant: Century Micro Display Technology (Shenzhen) Co., Ltd., Shenzhen (CN)

(72) Inventors: I-Wei Wu, New Taipei (TW); Chang-Ting Lin, New Taipei (TW)

(73) Assignee: Century Micro Display Technology (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/239,762

(22) Filed: Jan. 4, 2019

(65) Prior Publication Data

US 2019/0221589 A1 Jul. 18, 2019

Related U.S. Application Data (60) Provisional application No. 62/616,448, filed on Jan. 12, 2018.

(51) Int. Cl.
*H01L 27/12* (2006.01)
*H01L 27/15* (2006.01)
(Continued)

(52) U.S. Cl.
CPC ........ *H01L 27/1248* (2013.01); *H01L 27/156* (2013.01); *H01L 27/3211* (2013.01); *H01L 27/3258* (2013.01); *H01L 33/00* (2013.01); *H01L 33/005* (2013.01); *H01L 51/56* (2013.01); *H01L 51/5012* (2013.01); *H01L 51/5225* (2013.01); *H01L 2227/323* (2013.01); *H01L 2251/558* (2013.01)

(58) Field of Classification Search
CPC ............... H01L 27/1248; H01L 27/156; H01L 27/3258; H01L 51/56; H01L 33/005; H01L 2227/323; H01L 33/00; H01L 27/3211; H01L 51/5012; H01L 51/5225; H01L 27/12; H01L 27/15; H01L 27/32; H01L 51/52; H01L 51/50; H01L 2251/558
USPC ......................................................... 257/40
See application file for complete search history.

(56) References Cited

U.S. PATENT DOCUMENTS 6,661,484 B1 12/2003 Iwai et al.
2016/0322602 A1* 11/2016 Jung .................. H01L 29/7869
(Continued)

FOREIGN PATENT DOCUMENTS

| CN | 1270326 A | 10/2000 |
|---|---|---|
| CN | 106960912 A | 7/2017 |
| TW | 201820605 A | 6/2018 |

*Primary Examiner* — Alexander O Williams
(74) *Attorney, Agent, or Firm* — ScienBiziP, P.C.

(57) ABSTRACT

A method for manufacturing a display panel to comprise light emitting elements which together present a flat and wrinkle-free top surface includes a substrate, a TFT array layer arranged on the substrate, an insulating layer arranged on a surface of the TFT array layer away from the substrate, and light emitting elements arranged on a surface of the insulating layer away from the TFT array layer. Top surfaces of the light emitting elements away from the insulating layer are coplanar. Thicknesses of the light emitting elements are different from each other, and thicknesses of the insulating layer below different light emitting elements are different from each other. A display panel applying the method is also disclosed.

8 Claims, 11 Drawing Sheets

(51) Int. Cl.
*H01L 27/32* (2006.01)
*H01L 51/56* (2006.01)
*H01L 33/00* (2010.01)
*H01L 51/52* (2006.01)
*H01L 51/50* (2006.01)

(56) References Cited

U.S. PATENT DOCUMENTS

| | | |
|---|---|---|
| 2018/0061905 A1 | 3/2018 | Choi et al. |
| 2018/0061906 A1* | 3/2018 | Kim ................... H01L 27/326 |
| 2018/0181240 A1* | 6/2018 | Heo ................... H01L 51/5284 |
| 2019/0273125 A1* | 9/2019 | Takechi ............. H01L 51/5228 |
| 2019/0302959 A1* | 10/2019 | Clark ................. G06F 3/0443 |
| 2019/0312099 A1* | 10/2019 | Matsueda ........... G09G 3/3233 |
| 2019/0341002 A1* | 11/2019 | Kimura ............... G09G 3/2003 |
| 2019/0341565 A1* | 11/2019 | Li ...................... H01L 51/0097 |
| 2019/0391691 A1* | 12/2019 | Zhou .................. H01L 27/3276 |

\* cited by examiner

DISPLAY PANEL WITH LEDS IN DIFFERENT THICKNESSES FORMING A FLAT SURFACE AND METHOD FOR FABRICATING DISPLAY PANEL

FIELD

The present disclosure relates to manufacture of display panel.

BACKGROUND

Figure 8:
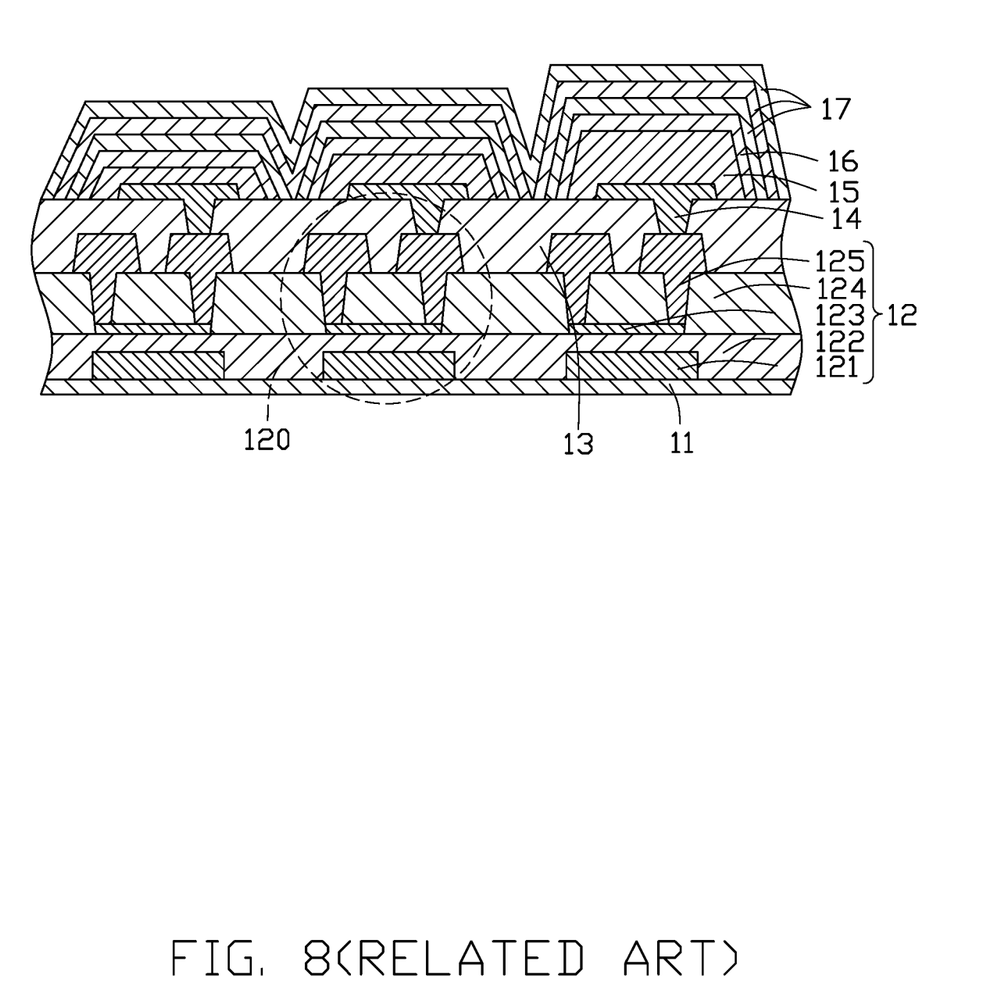
FIG. 8 is a cross-sectional view of a display panel in a related art.

Display panels display images based on light emitted by a backlight module. As shown in FIG. 8, a conventional display panel can include a substrate 11, an array layer 12 of thin film transistors (TFT) formed on the substrate 11, an insulating layer 13 formed on the TFT array layer 12, a first conducting layer 14 formed on the insulating layer 13, light emitting elements 15 formed on the insulating layer 13, a second conducting layer 16 formed on the light emitting elements 15, and the encapsulating layers 17 formed on the second conducting layer 16. The TFT array layer 12 includes a plurality of TFTs 120 in a matrix. The insulating layer 13 is positioned between the TFT array layer 12 and the plurality of light emitting elements 15. The insulating layer 13 covers the plurality of TFTs 120, and insulates the plurality of TFTs 120 from the plurality of light emitting elements 15. The encapsulating layers 17 encapsulate the light emitting elements 15. The light emitting elements 15 may be organic light emitting diodes (OLEDs), micro-light emitting diodes (pLEDs), or quantum dots light emitting diodes (QLED). A micro-light emitting diode may be 50×50 μm in size. A top surface of the conducting layer 14 close to the light emitting elements 15 is substantially flat. However, the light emitting elements 15 of different colors formed on the top surface 131 of the insulating layer 13 have different sizes, and especially have different heights. Different sizes of different color light emitting elements 15 cause wrinkles in display panel and packaging surfaces of the encapsulating layers 17 are not flat when the light emitting elements 15 are encapsulated by a thin film encapsulation technology. This leads to holes or apertures in the encapsulating layers 17, and moisture may enter the display panel from these holes or apertures. The light emitting elements 15 are μLEDs. Fabrication of the display panel comprises transferring the μLEDs onto the top surface 131 of the insulating layer 13 so as to transfer μLEDs of one color at one time. μLEDs with different colors have different heights, μLEDs of one color having a specified height. The blue μLEDs may be transferred last. During the transfer of the blue μLEDs, the blue μLEDs to face the already-mounted red or green μLEDs are connected to the red or green μLEDs based on the different heights of the μLEDs, the blue μLEDs being assembled in the wrong positions, effectively speaking.

Thus, there is room for improvement in the art.

BRIEF DESCRIPTION OF THE FIGURES

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

The present disclosure provides a display panel with the light emitting elements arranged so as to be present a substantially flat top surface. Top surfaces of the light emitting elements of all color are in one plane.

Figure 1:
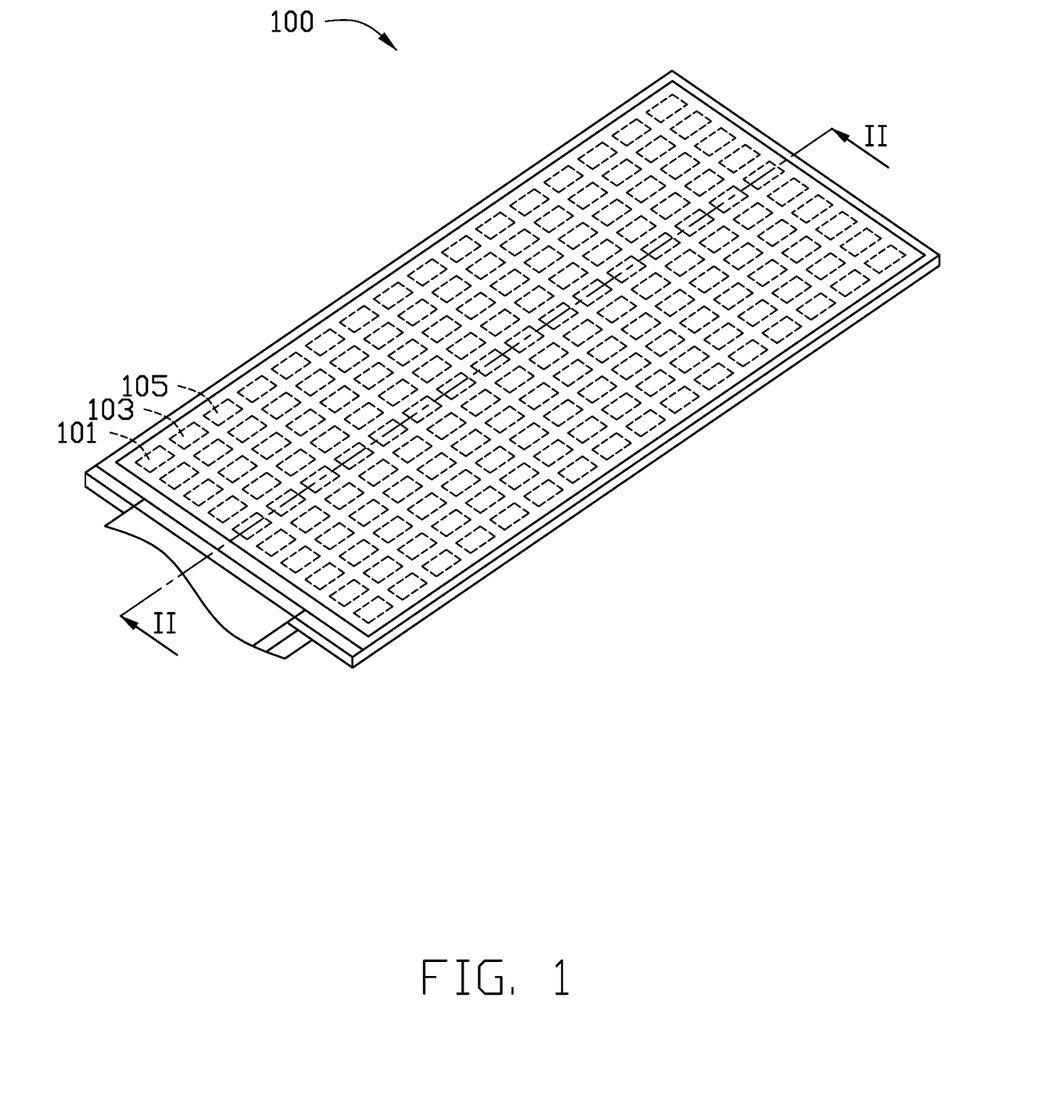
FIG. 1 is an isometric view of an embodiment of a display panel.
Figure 2:
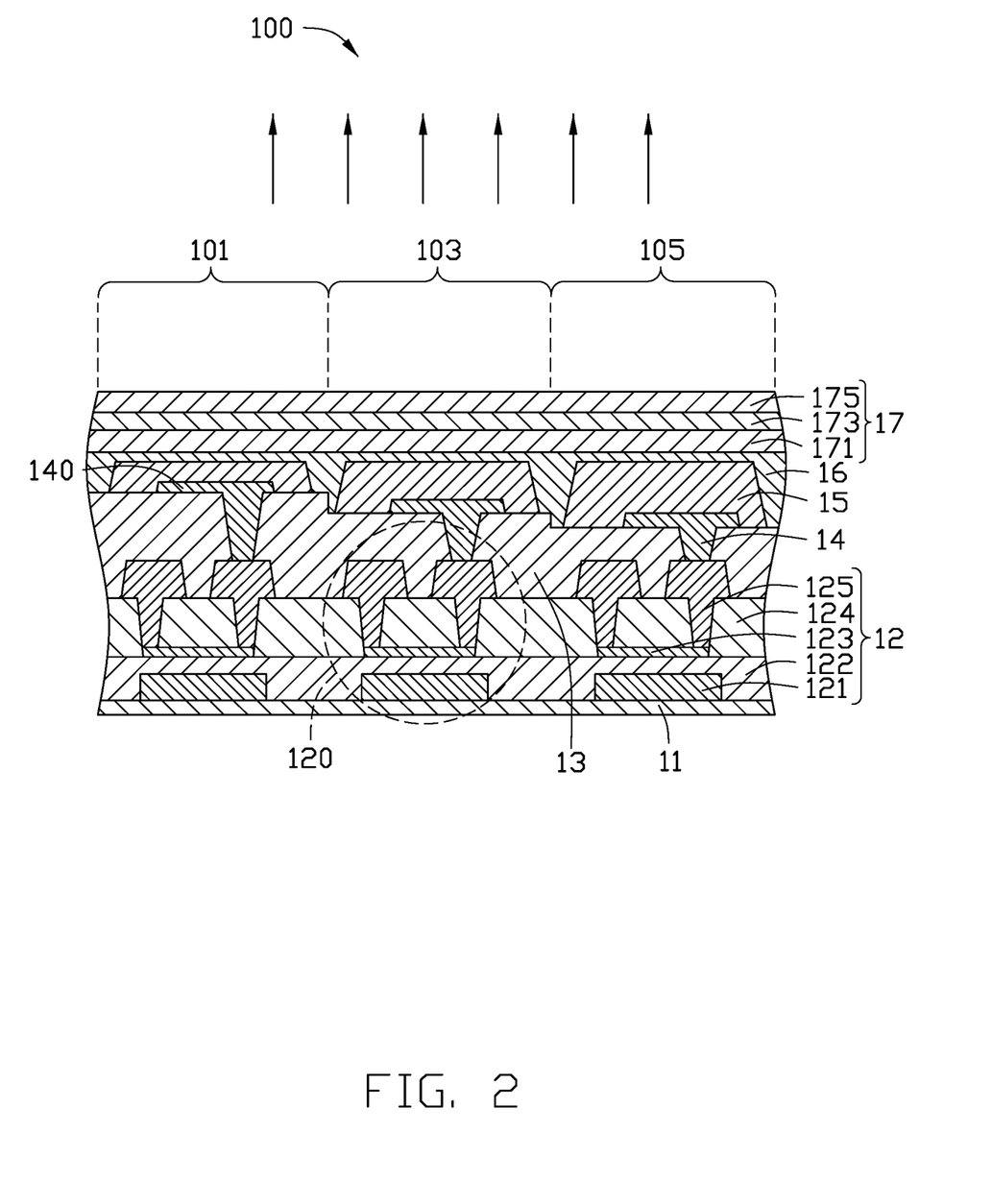
FIG. 2 is a cross-sectional view of a first embodiment of the display panel of FIG. 1.

FIGS. 1 and 2 show a display panel 100 according to a first embodiment. The display panel 100 defines first panel regions 101, second panel regions 103, and third panel regions 105. Each first panel region 101, each second panel region 103, and each third panel region 105 corresponds to a sub-pixel. Each second region 103 is disposed between one of the first panel regions 101 and one of the third panel regions 105. In the embodiment, each first panel region 101 represents a blue sub-pixel, each second panel region 103 a green sub-pixel represents a green sub-pixel, and each third panel region 105 represents a red sub-pixel. In other embodiments, the display panel 100 further can defines fourth regions serving as white sub-pixels. FIG. 2 only shows one first panel region 101, one second panel region 103, and one third panel region 105.

The display panel 100 includes a substrate 11, a TFT array layer 12, an insulating layer 13, a first conducting layer 14, a light emitting layer 15 with light emitting elements, a second conducting layer 16, and at least one encapsulating layer 17.

The substrate 11 provides structural support. The substrate 11 typically includes an insulating material. Suitable materials for the substrate 11 may include glass, quartz, and plastic, which has sufficient optical transparency. In some embodiments, the substrate 11 may comprise ceramic and/or silicon materials. In some applications, flexible substrate materials may be adopted. Suitable choices of material for the flexible substrate may include, for example, polyethersulfone (PES), polyethylenenaphthalate (PEN), polyethylene (PE), polyimide (PI), polyvinyl chloride (PVC), and polyethylene terephthalate (PET), or combinations thereof.

The TFT array layer 12 is arranged on a surface of the substrate 11. The TFT array layer 12 includes TFTs 120 in a matrix. The TFT array layer 12 includes a gate layer 121, a gate insulating layer 122, a channel layer 123, a barrier layer 124, and a source/drain layer 125. The gate layer 121 is located on a surface of the substrate 11, and is patterned to form gate electrodes of the TFTs 120. The gate insulating layer 122 is located on a surface of the gate layer 121 away from the substrate 11. The gate insulating layer 122 insulates the gate layer 121 from the channel layer 123. The channel layer 123 is located on a surface of the gate insulating layer 122 away from the gate layer 121. The channel layer 123 is patterned to form channels of the TFTs 120. The barrier layer 124 is located on a surface of the channel layer 123 away from the gate insulating layer 122. The barrier layer 124 provides insulation between the channel layer 122 and the source/drain layer 125. The source/drain layer 125 is located on a surface of the channel layer 123 away from the gate insulating layer 122. The source/drain layer 125 is patterned to form source and drain electrodes of the TFTs 120. The source and drain electrodes of the TFTs 120 are electrically connected to the channel layer by passing through the barrier layer 124. In the embodiment, the TFT 120 is a bottom type TFT. In other embodiments, the gate layer 121 can be arranged on the source/drain layer 125 to form a top type TFT 120.

The insulating layer 13 is arranged on a surface of the TFT array layer 12 away from the substrate 11. Thicknesses of the insulating layer 13 corresponding to the first, second, and third panel regions 101, 103, and 105 are different from each other along the light emitting direction. A thickness of the insulating layer 13 corresponding to the first panel regions 101 is thicker than a thickness of the insulating layer 13 corresponding to the second panel regions 103. The thickness of the insulating layer 13 corresponding to the second panel regions 103 is thicker than a thickness of the insulating layer 13 corresponding to the third panel regions 105.

The first conducting layer 14 is arranged on a surface of the insulating layer 13 away from the TFT array layer 12. The first conducting layer 14 is patterned to form first electrodes 140. The first electrodes 140 are electrically connected with the source/drain layer 125 passing through the insulating layer 13. Each first electrode 140 is an anode of the light emitting elements. In another embodiment, each first electrode 140 can be a cathode of the light emitting elements of the light emitting layer 15.

The light emitting layer 15 is arranged on a surface of the insulating layer 13 away from the TFT array layer 12. The light emitting layer 15 further covers side surfaces and top surfaces of a corresponding first electrode 140, and encapsulates the corresponding first electrode 140. A top surface of the light emitting layer 15 is substantially flat. The light emitting layer 15 includes first light emitting elements 15B, second light emitting elements 15G, and third light emitting elements 15R. In the embodiment, each first light emitting element 15B, each second light emitting element 15G, and each third light emitting element 15R is an organic light emitting diode (OLED). Each first light emitting element 15B, second light emitting element 15G, and third light emitting element 15R corresponds to one TFT 120. Each first light emitting element 15B emits first color light, e.g., blue, and faces each first panel region 101. Each second light emitting element 15G emits second color light, e.g., green, and faces each second panel region 103. Each third light emitting element 15R emits third color light, e.g., red, and faces each third panel region 105. In other embodiments, the light emitting layer 15 can also include fourth emitting elements emitting white light, each fourth emitting element corresponding to a fourth region. Each first light emitting element 15B is in a first specified thickness, each second light emitting element 15G, is in a second specified thickness, and each third light emitting element 15R is in a third specified thickness. The first specified thickness is thinner than the second specified thickness, and the second specified thickness is thinner than the third specified thickness. Top surfaces of the first, second, and third light emitting elements 15B, 15G, and 15R away from the insulating layer 13 are coplanar.

The second conducting layer 16 is arranged on a surface of the light emitting layer 15 away from the insulating layer 13, and fills in the gaps between the light emitting elements 12B, 15G, and 15R. The second conducting layer 16 is a cathode of the light emitting elements of the light emitting layer 15. In other embodiments, the second conducting layer 16 can be an anode of the light emitting elements of the light emitting layer 15. A top surface of the second conducting layer 16 away from the light emitting layer 15 is substantially flat. The second conducting layer 16 covers side surfaces and top surfaces of a corresponding light emitting element 15.

The encapsulating layer 17 is arranged on the second conducting layer 15. The encapsulating layer 17 encapsulates the second conducting layer 16 and the light emitting elements 15. A bottom surface of the encapsulating layer 17 adjacent to the second conducting layer 16 and a top surface of the encapsulating layer 17 away from the second conducting layer 16 are flat surfaces. The encapsulating layer 17 can include a first sub-encapsulating layer 171, a second sub-encapsulating layer 173, and a third sub-encapsulating layer 175. The multiple sub-encapsulating layers reinforce each other and enhance the encapsulation.

Figure 3:
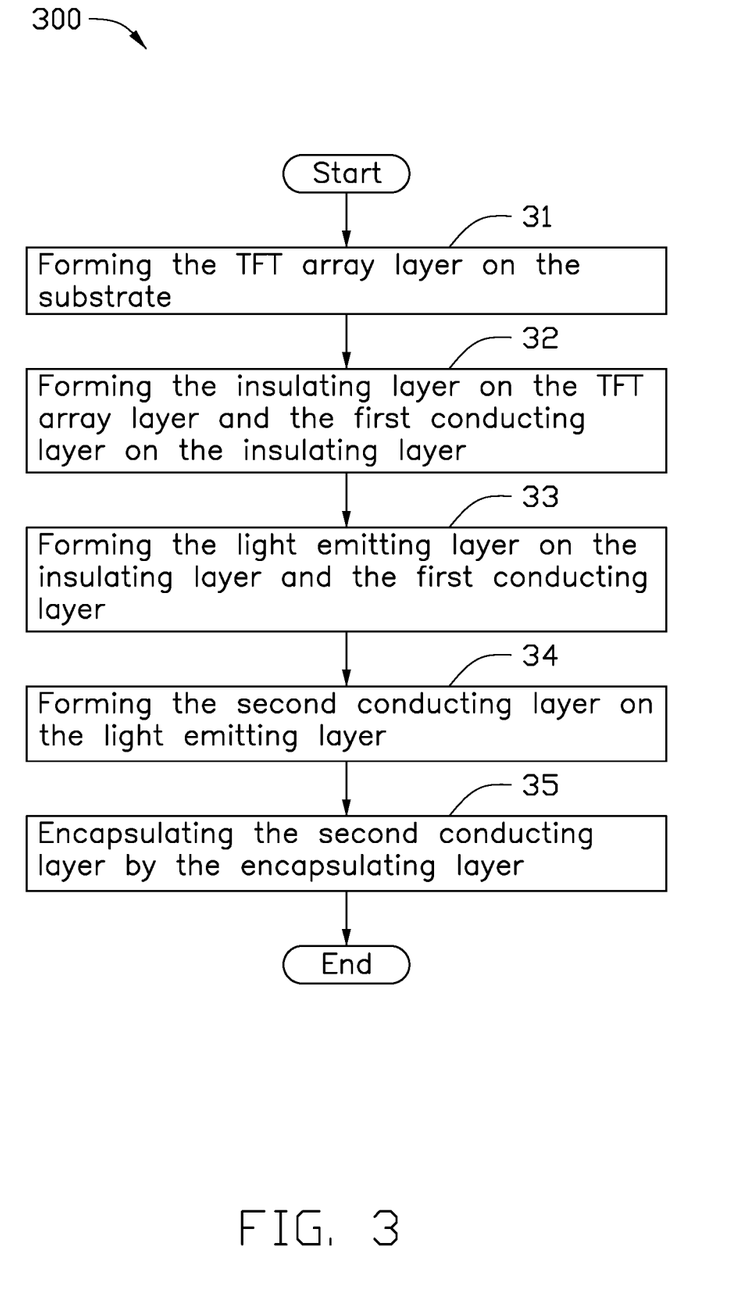
FIG. 3 is a flowchart of a first embodiment of a method for fabricating the display panel of FIG. 2.

FIG. 3 shows a method 300 for fabricating the display panel according to a first embodiment. The method 300 is provided by way of example, as there are a variety of ways to carry out the method 300. The method 300 described below may be carried out using the configurations shown in FIGS. 1-2 and FIG. 4A-4D, for example, and various elements of these figures are referenced in explaining the method 300. Each block shown in FIG. 3 represents one or more processes, methods, or subroutines, carried out in the method 300. Furthermore, the order of blocks is illustrative only and the order of the blocks can change. Additional blocks can be added or blocks can be removed, without departing from this disclosure. The method 300 can begin at block 31.

Figure 4A:
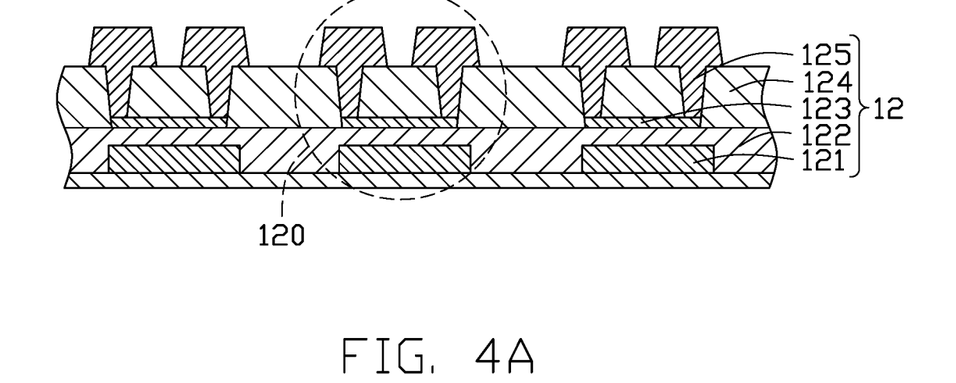
FIGS. 4A-4E are cross-sectional views of structure development in steps 41 through 44 of the method of FIG. 3.

At block 31, referring also to FIG. 4A, forming a TFT array layer on a substrate 11. The substrate 11 provides structural support. The substrate 11 typically includes an insulating material. Suitable materials for the substrate 11 may include glass, quartz, and plastic, which has sufficient optical transparency. In some embodiments, the substrate 11 may comprise ceramic and/or silicon materials. In some applications, flexible substrate materials may be adopted. Suitable choices of material for the flexible substrate may include, for example, polyethersulfone (PES), polyethylenenaphthalate (PEN), polyethylene (PE), polyimide (PI), polyvinyl chloride (PVC), and polyethylene terephthalate (PET), or combinations thereof. The TFT array layer 12 is arranged on a surface of the substrate 11. The TFT array layer 12 includes TFTs 120 in a matrix. The TFT array layer 12 includes a gate layer 121, a gate insulating layer 122, a channel layer 123, a barrier layer 124, and a source/drain layer 125. The gate layer 121 is located on a surface of the substrate 11, and is patterned to form gate electrodes of the TFTs 120. The gate insulating layer 122 is located on a surface of the gate layer 121 away from the substrate 11. The gate insulating layer 122 insulates the gate layer 121 from the channel layer 123. The channel layer 123 is located on a surface of the gate insulating layer 122 away from the gate layer 121. The channel layer 123 is patterned to form channels of the TFTs 120. The barrier layer 124 is located on a surface of the channel layer 123 away from the gate insulating layer 122. The barrier layer 124 insulates the channel layer 122 and the source/drain layer 125. The source/drain layer 125 is located on a surface of the channel layer 123 away from the gate insulating layer 122. The source/drain layer 125 is patterned to form source and drain electrodes of the TFTs 120.

Figure 4B:
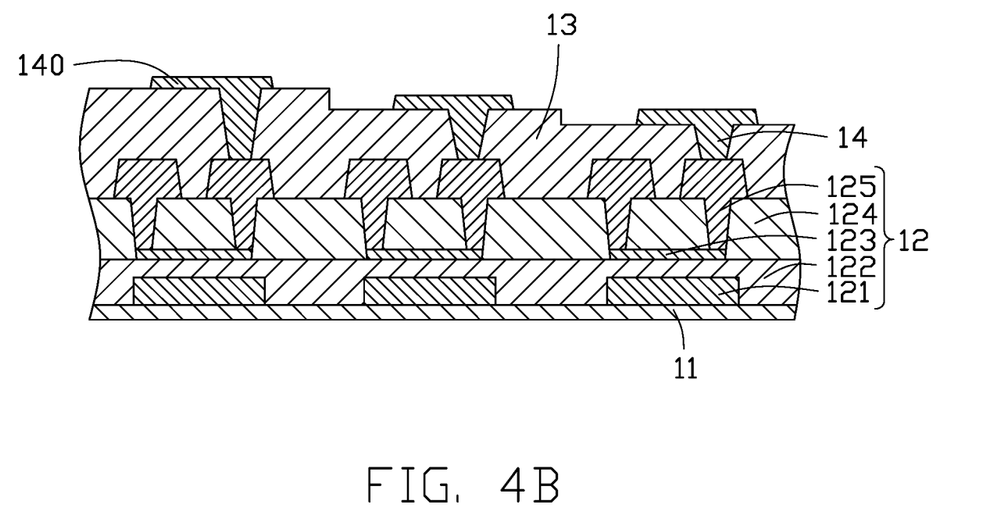

At block 32, in FIG. 4B, the insulating layer 13 is formed on the TFT array layer 12 and the first conducting layer 14 is formed on the insulating layer 13. The insulating layer 13 is arranged on a surface of the TFT array layer 12 away from the substrate 11. Thicknesses of the insulating layer 13 corresponding to the first, second, and third panel regions 101, 103, and 105 are different from each other along the light emitting direction. A thickness of the insulating layer 13 corresponding to the first panel regions 101 is thicker than a thickness of the insulating layer 13 corresponding to the second panel regions 103, and the thickness of the insulating layer 13 corresponding to the second panel regions 103 is thicker than a thickness of the insulating layer 13 corresponding to the third panel regions 105. The first conducting layer 14 is arranged on a surface of the insulating layer 13 away from the TFT array layer 12. The first conducting layer 14 is patterned to form first electrodes 140. The first electrodes 140 are electrically connected with the source/drain layer 125 passing through the insulating layer 13. Each first electrode 140 is an anode of the light emitting elements. In other embodiment, each first electrode 140 can be a cathode of the light emitting elements of the light emitting layer 15.

Figure 4C:
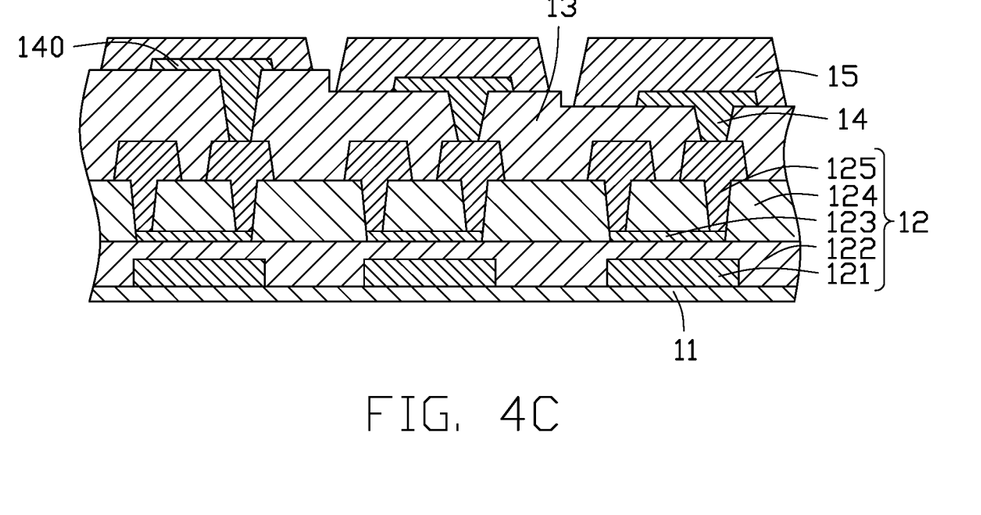

At block 33, in FIG. 4C, the light emitting layer 15 is formed on the insulating layer 13 and the first conducting layer 14. The light emitting layer 15 is arranged on a surface of the insulating layer 13 away from the TFT array layer 12. The light emitting layer 15 further covers side surfaces and top surfaces of a corresponding first electrode 140, and encapsulates the first electrodes 140. A top surface of the light emitting layer 15 is substantially flat. The light emitting layer 15 includes first light emitting elements 15B, second light emitting elements 15G, and third light emitting elements 15R. In the embodiment, each first light emitting elements 15B, second light emitting elements 15G, and third light emitting elements 15R is an organic light emitting diode (OLED). Each first light emitting element 15B, second light emitting element 15G, and third light emitting element 15R corresponds to one TFT 120. Each first light emitting element 15B, second light emitting element 15G, and third light emitting element 15R corresponds to one TFT 120. Each first light emitting element 15B emits first color light, e.g., blue, and faces each first panel region 101. Each second light emitting element 15G emits second color light, e.g., green, and faces each second panel region 103. Each third light emitting element 15R emits third color light, e.g., red, and faces each third panel region 105. In other embodiments, the light emitting layer 15 can also include fourth emitting elements emitting white light. Each first light emitting element 15B is in a first specified thickness, each second light emitting element 15G is in a second specified thickness, and each third light emitting element 15R is in a third specified thickness. The first specified thickness is thinner than the second specified thickness, and the second specified thickness is thinner than the third specified thickness. Top surfaces of the first, second, third light emitting elements 15B, 15G, and 15R away from the insulating layer 13 are coplanar. The first, second, and third light emitting elements 15B, 15G, 15R are fabricated in an evaporation process.

Figure 4D:
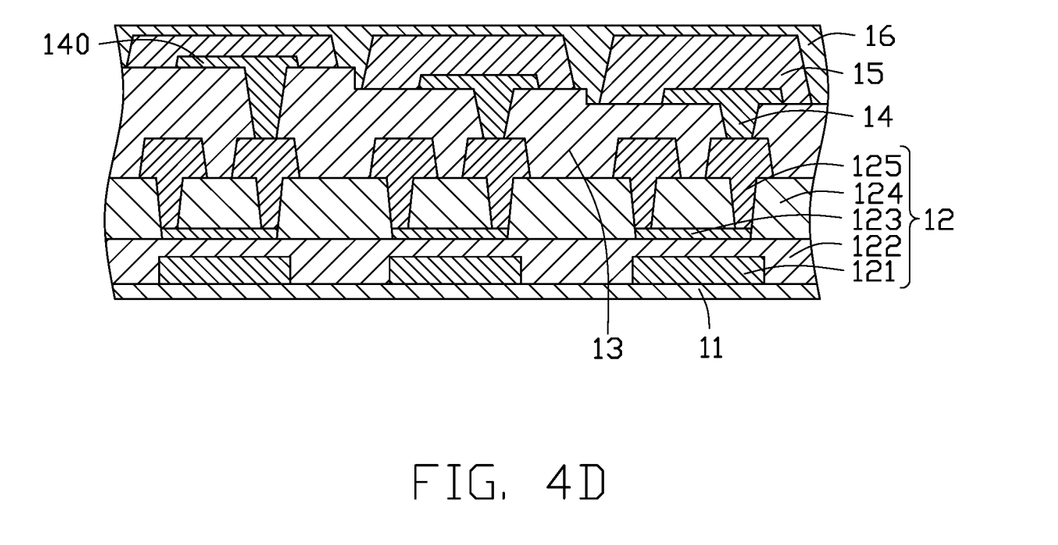

At block 34, in FIG. 4D, a second conducting layer 16 is formed on the light emitting layer 15. The second conducting layer 16 is arranged on a surface of the light emitting layer 15 away from the insulating layer 13, and fills in the gaps between the light emitting elements 12B, 15G, 15R. The second conducting layer 16 is a cathode of the light emitting elements of the light emitting layer 15. In other embodiments, the second conducting layer 16 can be an anode of the light emitting elements of the light emitting layer 15. A top surface of the second conducting layer 16 away from the light emitting layer 15 is substantially flat.

Figure 4E:
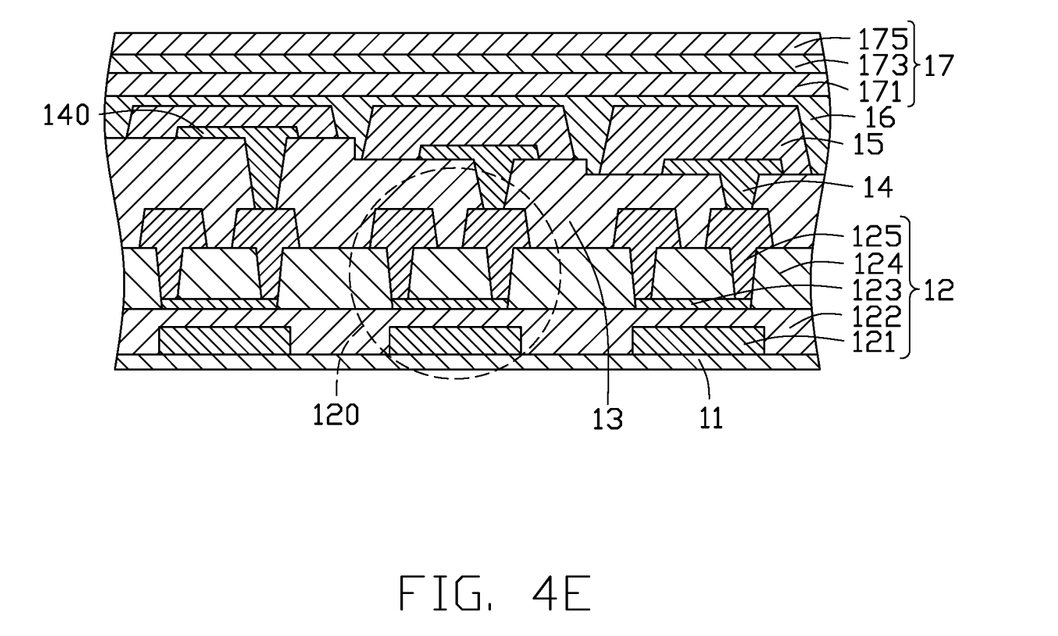

At block 35, in FIG. 4E, the second conducting layer 16 is encapsulated by the encapsulating layer 17. The encapsulating layer 17 is arranged on the second conducting layer 16. A top surface of the encapsulating layer 17 is flat. The encapsulating layer 17 can include a first sub-encapsulating layer 171, a second sub-encapsulating layer 173, and a third sub-encapsulating layer 175.

As the above description, the top surfaces of the first, second, and third light emitting elements 15B, 15G, and 15R away from the insulating layer 13 are coplanar, undesired holes or apertures are effectively prevented, and entrance paths of water or water vapor are reduced. Thus, a performance of the display panel is improved.

Figure 5:
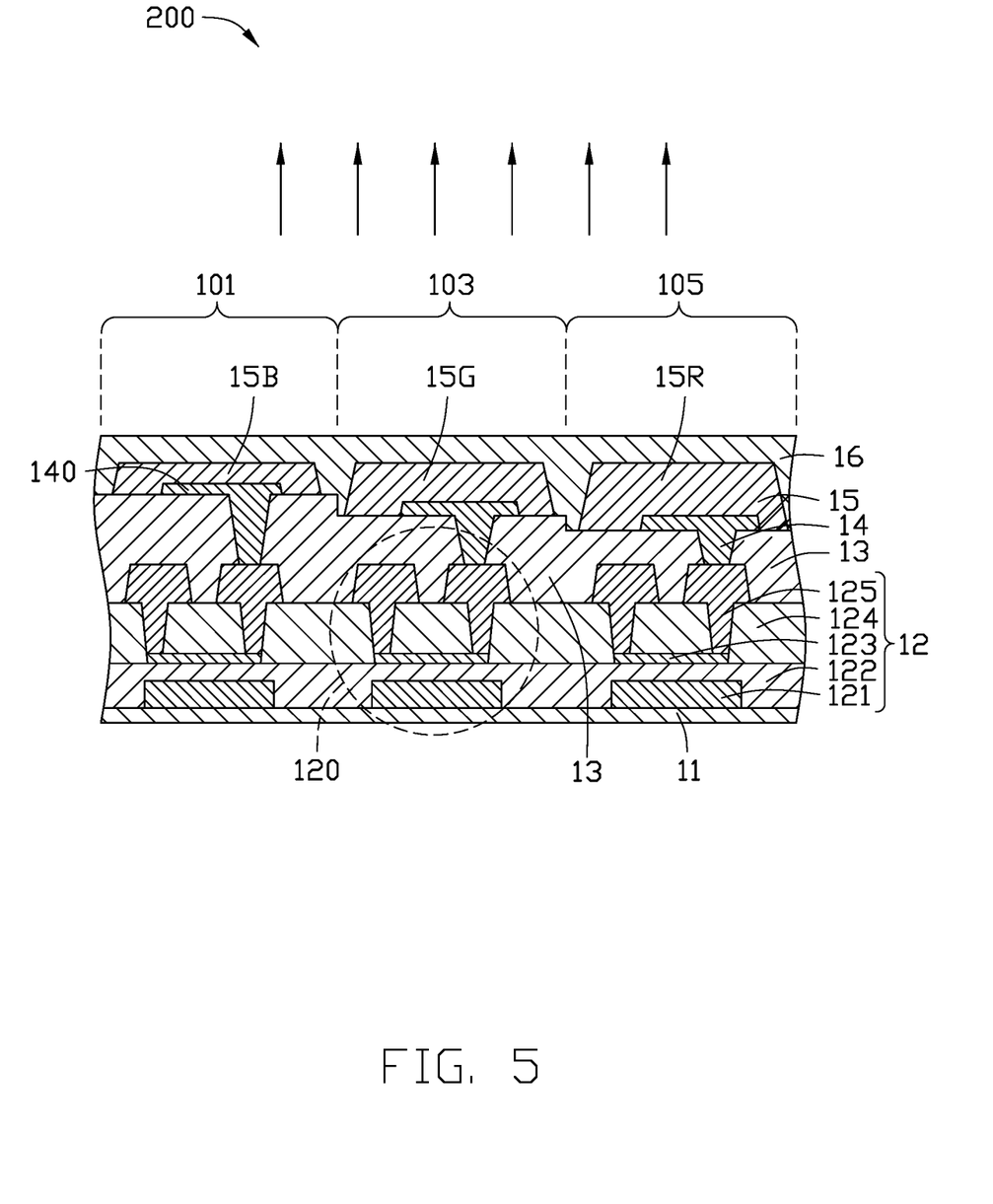
FIG. 5 is a cross-sectional view of a second embodiment of the display panel of FIG. 1.

FIG. 5 shows a display panel 200 according to a second embodiment. In the second embodiment, encapsulating layer 17 is removed. The difference between the display panel 200 and the display panel 100 is the light emitting elements 15, and the manner of fabrication of forming the light emitting layer 15.

The first, second, and third light emitting elements 15B, 15G, 15R are micro-light emitting diodes (μLEDs).

Figure 6:
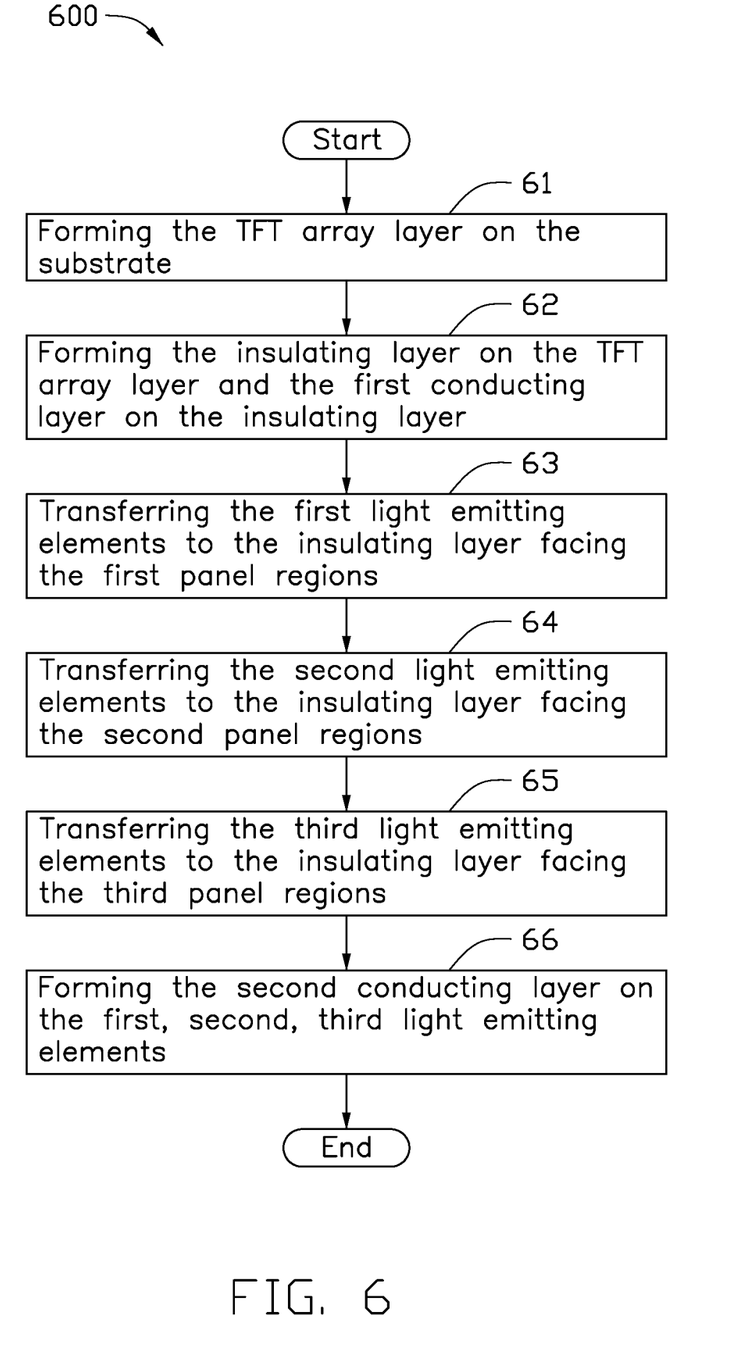
FIG. 6 is a flowchart of a second embodiment of a method for fabricating the display panel of FIG. 5.

FIG. 6 shows a method 600 for fabricating the display panel 200 according to a second embodiment. The method 600 is provided by way of example, as there are a variety of ways to carry out the method 600. The method 600 described below may be carried out using the configurations shown in FIG. 5 and FIG. 7A-7F, for example, and various elements of these figures are referenced in explaining the method 600. Each block shown in FIG. 6 represents one or more processes, methods, or subroutines, carried out in the method 600. Furthermore, the order of blocks is illustrative only and the order of the blocks can change. Additional blocks can be added or blocks can be removed, without departing from this disclosure. The method 600 can begin at block 61.

Figure 7A:
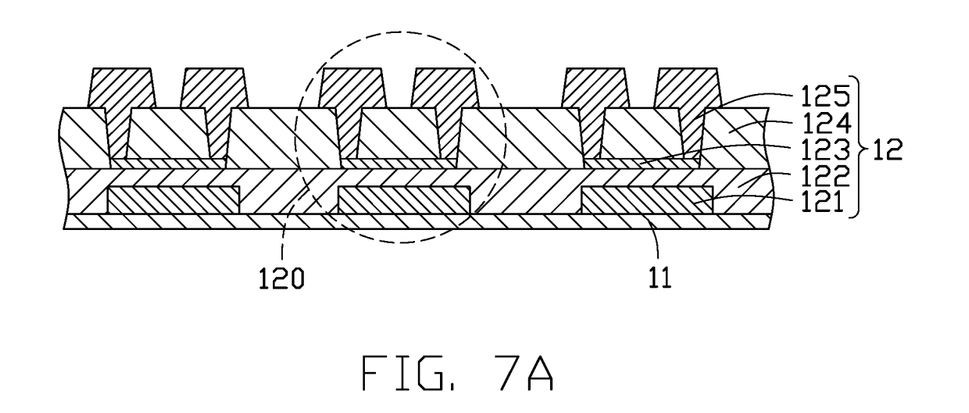
FIGS. 7A-7F are cross-sectional views of structure development in steps 61 through 65 of the method of FIG. 6.

At block 61, in FIG. 7A, a TFT array layer is formed on a substrate 11. The substrate 11 provides structural support. The substrate 11 typically includes an insulating material. Suitable materials for the substrate 11 may include glass, quartz, and plastic, which has sufficient optical transparency. In some embodiments, the substrate 11 may comprise ceramic and/or silicon materials. In some applications, flexible substrate materials may be adopted. Suitable choices of material for the flexible substrate may include, for example, polyethersulfone (PES), polyethylenenaphthalate (PEN), polyethylene (PE), polyimide (PI), polyvinyl chloride (PVC), and polyethylene terephthalate (PET), or combinations thereof. The TFT array layer 12 is arranged on a surface of the substrate 11. The TFT array layer 12 includes TFTs 120 in a matrix. The TFT array layer 12 includes a gate layer 121, a gate insulating layer 122, a channel layer 123, and a source/drain layer 125. The gate layer 121 is located on a surface of the substrate 11, and is patterned to form gate electrodes of the TFTs 120. The gate insulating layer 122 is located on a surface of the gate layer 121 away from the substrate 11. The gate insulating layer 122 insulates the gate layer 121 from the channel layer 123. The channel layer 123 is located on a surface of the gate insulating layer 122 away from the gate layer 121. The channel layer 123 is patterned to form channels of the TFTs 120. The barrier layer 124 is located on a surface of the channel layer 123 away from the gate insulating layer 122. The barrier layer 124 provides insulation between the channel layer 122 and the source/drain layer 125. The source/drain layer 125 is located on a surface of the channel layer 123 away from the gate insulating layer 122. The source/drain layer 125 is patterned to form source and drain electrodes of the TFTs 120.

Figure 7B:
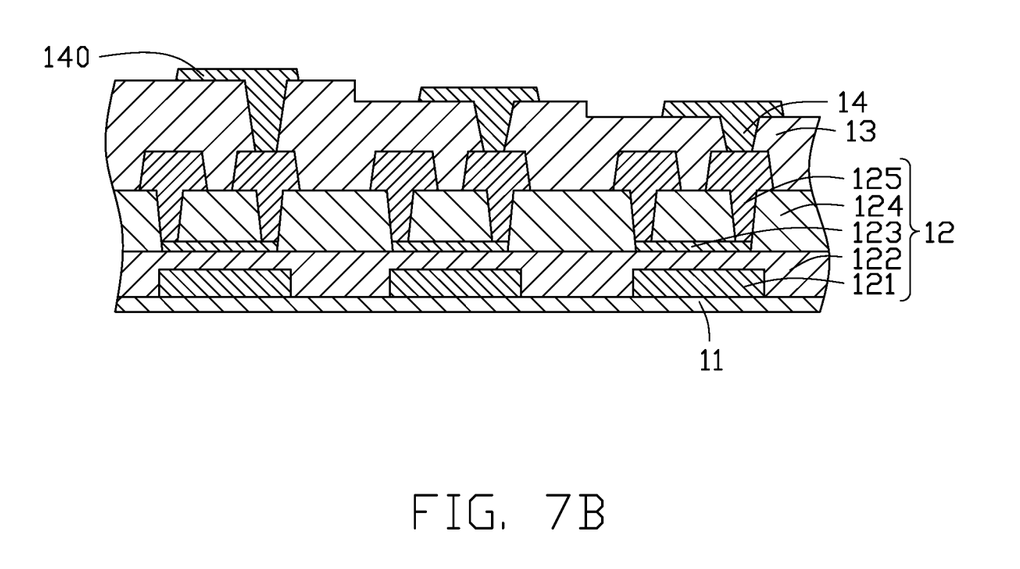

At block 62, referring also to FIG. 7B, forming the insulating layer 13 on the TFT array layer 12 and the first conducting layer 14 on the insulating layer 13. The insulating layer 13 is arranged on a surface of the TFT array layer 12 away from the substrate 11. Thicknesses of the insulating layer 13 corresponding to the first, second, and third panel regions 101, 103, and 105 are different from each other along the light emitting direction. A thickness of the insulating layer 13 corresponding to the first panel regions 101 is thicker than a thickness of the insulating layer 13 corresponding to the second panel regions 103. The thickness of the insulating layer 13 corresponding to the second panel regions 103 is thicker than a thickness of the insulating layer 13 corresponding to the third panel regions 105. The first conducting layer 14 is arranged on a surface of the insulating layer 13 away from the TFT array layer 12. The first conducting layer 14 is patterned to form first electrodes 140. The first electrodes 140 are electrically connected with the source/drain layer 125 passing through the insulating layer 13. Each first electrode 140 is an anode of the light emitting elements. In other embodiment, each first electrode 140 can be a cathode of the light emitting elements of the light emitting layer 15.

Figure 7C:
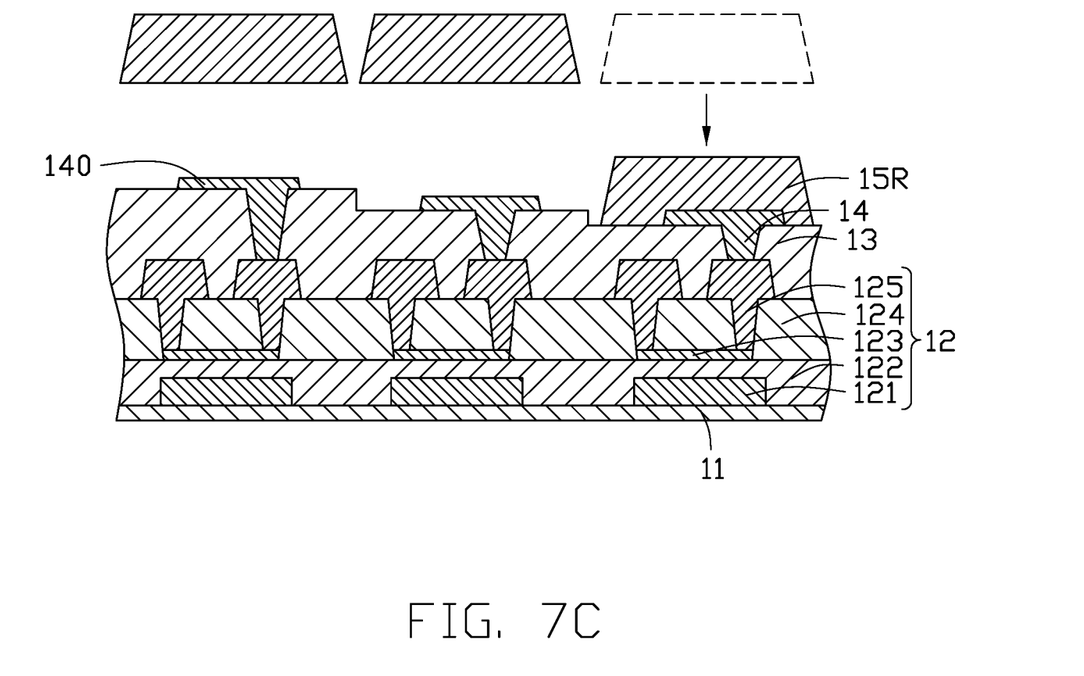

At block 63, in FIG. 7C, the first light emitting elements 15B are transferred on the insulating layer 13 facing the first panel regions 101. The first light emitting elements 15B are arranged on a surface of the insulating layer 13 away from the TFT array layer 12. The first light emitting elements 15B further cover side surfaces and top surfaces of the first electrodes 140, and encapsulate the first electrodes 140. In the embodiment, each first light emitting element 15B is micro-light emitting diode (μLED). Each first light emitting element 15B emits first color light, and faces each first panel region 101. In the embodiment, the first light emitting element 15B emits blue light. Each first light emitting element 15B is in a first specified thickness.

Figure 7D:
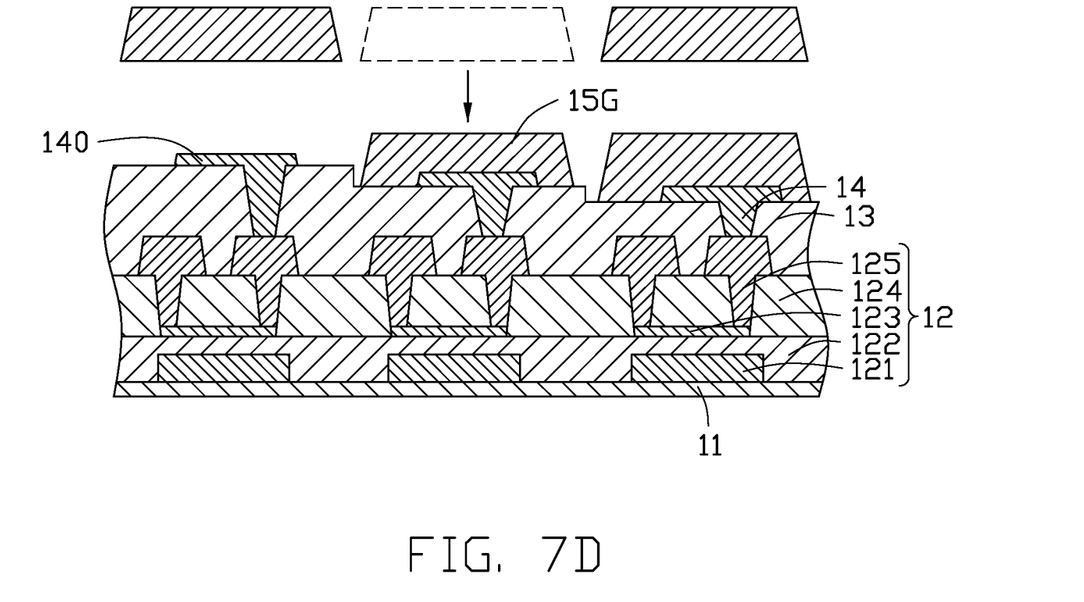

At block 64, in FIG. 7D, the second light emitting elements 15G are transferred on the insulating layer 13 facing the second panel regions 103. Each second light emitting element 15G emits second color light, and faces each second panel region 103. In the embodiment, the second light emitting element 15G emits green light. Each second light emitting element 15G is in a second specified thickness.

Figure 7E:
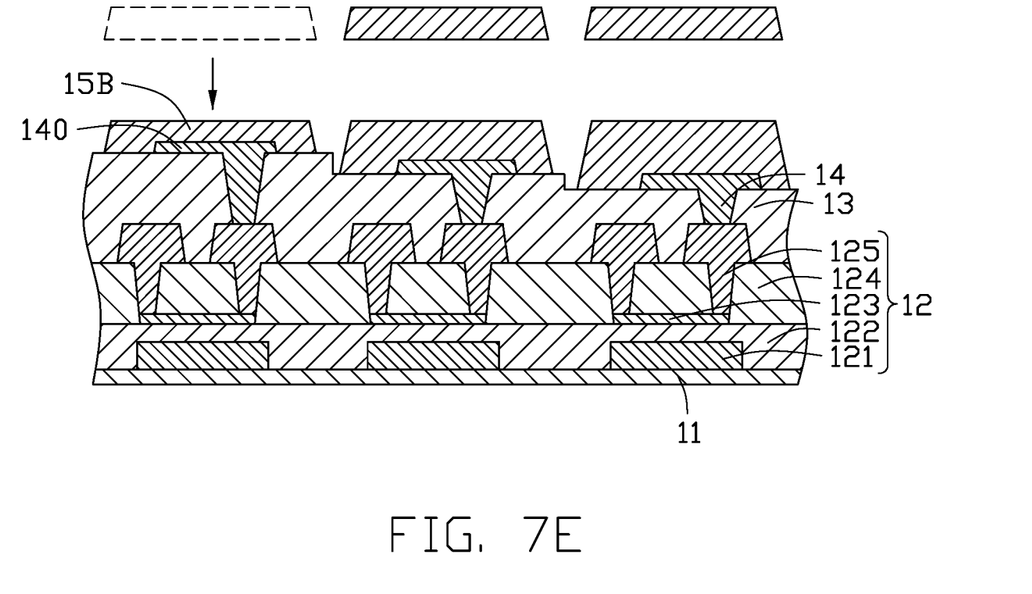

At block 65, in to FIG. 7E, the third light emitting elements 15R are transferred on the insulating layer 13 facing the third panel regions 105. Each light emitting element 15R emits third color light, and faces each third panel region 105. In the embodiment, the third light emitting element 15R emits red color light. Each third light emitting element 15R is in a third specified thickness. The first specified thickness is thinner than the second specified thickness, and the second specified thickness is thinner than the third specified thickness. Top surfaces of the light emitting layer 15 away from the insulating layer 13 are coplanar.

Figure 7F:
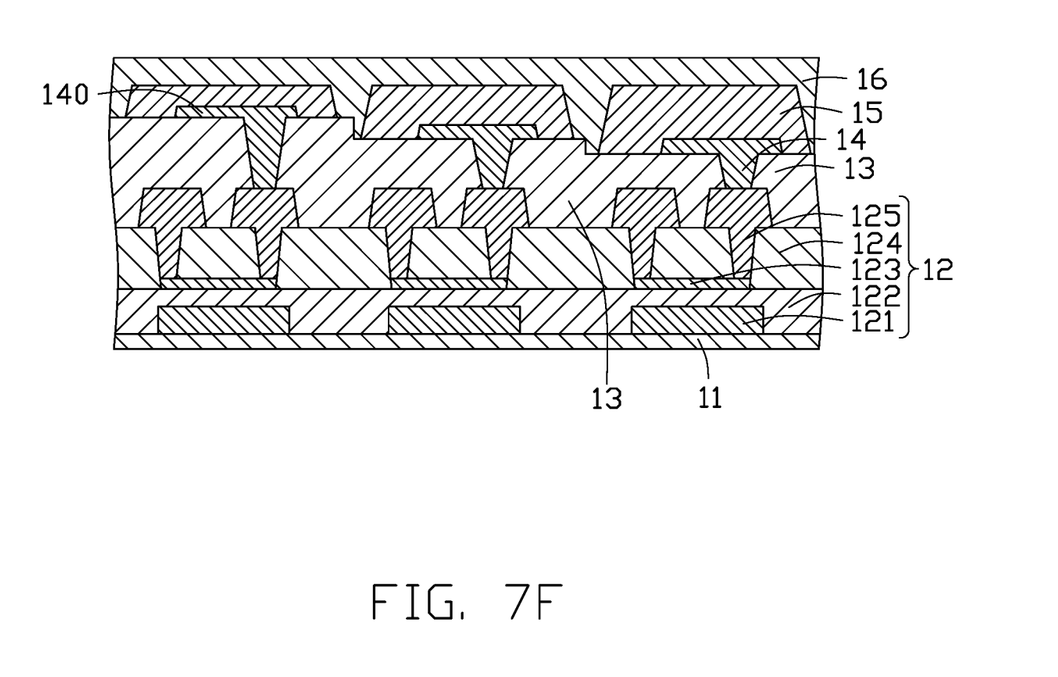

At block 66, in FIG. 7F, a second conducting layer 16 is formed on the light emitting layer 15. The second conducting layer 16 is arranged on a surface of the light emitting layer 15 away from the insulating layer 13, and fills in the gaps between the light emitting elements 12B, 15G, and 15R. The second conducting layer 16 is a cathode of the light emitting elements of the light emitting layer 15. In other embodiments, the second conducting layer 16 can be an anode of the light emitting elements of the light emitting layer 15. A top surface of the second conducting layer 16 away from the light emitting layer 15 is substantially flat.

As the above description, the top surfaces of the light emitting layer 15 away from the insulating layer 13 are coplanar, cross-interference between the transferring operations of the first, second, and third light emitting elements 15B, 15G, and 15R with different color is avoided. Thus, a performance of the display panel is improved.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A display panel, defining first panel regions, second panel regions, and third panel regions thereon, the display panel comprising:
   a substrate;
   a TFT array layer arranged on the substrate;
   an insulating layer arranged on a surface of the TFT array layer away from the substrate; and
   a light emitting layer arranged on a surface of the insulating layer away from the TFT array layer;
   wherein the light emitting layer comprises a plurality of first light emitting elements, a plurality of second light emitting elements, and a plurality of third light emitting elements, each first light emitting element faces a corresponding first panel region, each second light emitting element faces a corresponding second panel region, each third light emitting element faces a corresponding third panel region; top surfaces of the first light emitting elements, the second light emitting elements, and the third light emitting elements away from the insulating layer are coplanar with each other;
   wherein each first light emitting element has a first specified thickness, each second light emitting element has a second specified thickness, and each third light emitting element has a third specified thickness; the first specified thickness, the second specified thickness, and the third specified thickness are different from each other along a direction perpendicular to the substrate; a distance between the first light emitting element and a surface of the insulating layer in the first panel region, a distance between the second light emitting element and the surface of the insulating layer in the second panel region, and a distance between the third light emitting element and the surface of the insulating layer in the third panel region are different from each other; a sum of thicknesses of the first light emitting element and the insulating layer below the first light emitting element is equal to a sum of thicknesses of the second emitting element and the insulating layer below the second emitting element, and is further equal to a sum of thicknesses of the third light emitting element and the insulating layer below the third light emitting layer.

2. The display panel of claim 1, wherein a thickness of the insulating layer corresponding to the first panel regions is thicker than a thickness of the insulating layer corresponding to the second panel regions, and the thickness of the insulating layer corresponding to the second panel regions is thicker than a thickness of the insulating layer corresponding to the third panel regions.

3. The display panel of claim 2, wherein each first light emitting element emits a first color light; each second light emitting element emits a second color light; each third light emitting element emits a third color light, and the first, second, and third color light are different from each other.

4. The display panel of claim 1, further comprising an encapsulating layer arranged on the insulating layer; wherein the encapsulating layer encapsulates the light emitting layer.

5. The display panel of claim 4, further comprising a first conducting layer arranged between the insulating layer and the TFT array layer; wherein the first conducting layer is patterned to form a plurality of first electrodes; each light emitting element encapsulates side surfaces and a top surface of one of the first electrodes; each first electrode is electrically connected to the TFT array layer, and acts as an anode layer.

6. The display panel of claim 1, further comprising a second conducting layer; wherein the second conducting layer is arranged between the light emitting layer and the encapsulating layer, and acts as a cathode layer.

7. The display panel of claim 1, wherein the first, second, and third light emitting elements are organic light emitting diodes; the light emitting elements are fabricated using an evaporation process.

8. The display panel of claim 1, wherein the first, second, and third light emitting elements are micro-light emitting diodes; the light emitting elements are fabricated using a transferring process.

* * * * *